(12) United States Patent
Dolan et al.

(10) Patent No.: US 11,275,673 B1
(45) Date of Patent: Mar. 15, 2022

(54) SIMULATED LIDAR DATA

(71) Applicant: Zoox, Inc., Foster City, CA (US)

(72) Inventors: James Graham Dolan, Foster City, CA (US); Tod Cameron Semple, Woodside, CA (US)

(73) Assignee: Zoox, Inc., Foster City, CA (US)

( * ) Notice: Subject to any disclaimer, the term of this patent is extended or adjusted under 35 U.S.C. 154(b) by 68 days.

(21) Appl. No.: 16/450,522

(22) Filed: Jun. 24, 2019

(51) Int. Cl.
*G06F 11/36* (2006.01)
*G05D 1/00* (2006.01)
*G01S 17/89* (2020.01)

(52) U.S. Cl.
CPC ....... *G06F 11/3664* (2013.01); *G05D 1/0055* (2013.01); *G05D 1/0088* (2013.01); *G01S 17/89* (2013.01); *G05D 2201/0213* (2013.01)

(58) Field of Classification Search
CPC .......... G06F 11/3664; G05D 1/0055; G05D 1/0088; G05D 2201/0213; G01S 17/89
See application file for complete search history.

(56) References Cited

U.S. PATENT DOCUMENTS

| | | | |
|---|---|---|---|
| 2002/0042690 A1* | 4/2002 | Shimbo ................. | G02B 26/12 |
| | | | 702/167 |
| 2017/0030703 A1* | 2/2017 | Cosic .................... | G01B 11/02 |
| 2017/0168146 A1* | 6/2017 | Boehmke ............. | G01S 17/931 |
| 2019/0004535 A1* | 1/2019 | Huang .................. | G05D 1/0251 |
| 2019/0050998 A1* | 2/2019 | Kirby ..................... | G06T 7/579 |
| 2020/0082547 A1* | 3/2020 | Xie ......................... | G06T 7/246 |
| 2020/0160598 A1* | 5/2020 | Manivasagam ......... | G01S 17/89 |
| 2020/0326717 A1* | 10/2020 | Chen .................... | G05D 1/0221 |

* cited by examiner

*Primary Examiner* — Ziaul A Chowdhury
(74) *Attorney, Agent, or Firm* — Lee & Hayes, P.C.

(57) ABSTRACT

A system for generating simulated LiDAR data may include a depth offset generator and an intensity value generator. The depth offset generator may be configured to receive environment data including depth information, e.g., a depth map, the environment. The depth offset generator may determine an optical flow field from the depth information and estimate depths for positions to simulate LiDAR sensor data. field. The depth offset generator can also generate timestamp information based on attributes of the simulated LiDAR sensor, and determine the estimated depths using the timestamp information. The intensity value generator may be configured to determine an intensity for pixels based on physical attributes associated with those pixels. The simulated LiDAR data may be used in simulations run on autonomous vehicle control systems.

20 Claims, 6 Drawing Sheets

SIMULATED LIDAR DATA

BACKGROUND

Vehicles are increasingly supplementing or replacing manual functionality with automatic controls. Fully-autonomous vehicles are reducing all passengers to passive participants as they are shuttled to their destination. Autonomous driving, however, requires robust computing systems capable of making split-second decisions to respond to myriad events and scenarios. Robustness of a computing system may be confirmed via physical tests, e.g., by driving the vehicle in one or more environments for extended periods of time and/or for numerous miles. However, physical testing has limits. For instance, performing physical tests among traffic and pedestrians may be unsafe. Moreover, it may be virtually impossible to exactly repeat physical tests. Physical testing also limits the practicable number of scenarios that can be tested. Accordingly, simulations can be used to test operating software for autonomous vehicles in some instances. Simulations attempt to re-create the world and obstacles within the world to accurately reproduce scenarios that can be encountered by an autonomous vehicle.

BRIEF DESCRIPTION OF THE DRAWINGS

The detailed description is described with reference to the accompanying figures. In the figures, the left-most digit(s) of a reference number identifies/identify the figure in which the reference number first appears. The same reference numbers in different figures indicate similar or identical items.

DETAILED DESCRIPTION

Figure 1:
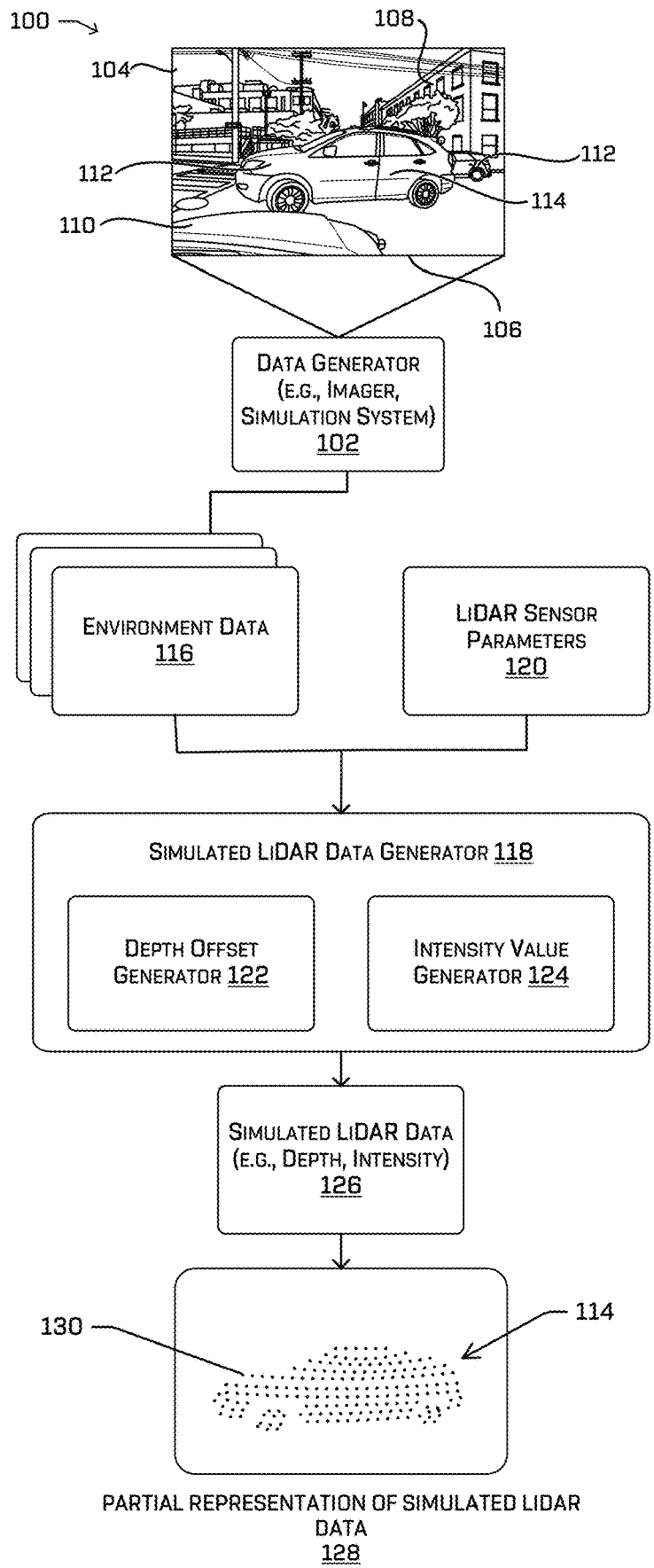
FIG. 1 is a schematic diagram illustrating an example process for generating simulated LiDAR data from environment data, according to examples of this disclosure.

As mentioned above, simulations may be useful to test systems, including autonomous vehicle controls systems. For instance, vehicles, such as autonomous vehicles, can include a number of sensors configured to generate sensor data about an environment. Such sensor data may be received from the sensors at the vehicle control system and used to perceive the environment. Based on these perceptions, the vehicle control system can generate controls to navigate in the environment.

One conventional type of sensor data that a system, such as a vehicle control system, can use to interpret an environment is LiDAR data. For example, an autonomous vehicle can include one or more LiDAR sensors, each configured to generate LiDAR returns about a 360-degree field of view around the vehicle. Generally, LiDAR returns can include both position information and intensity information. For instance, the position information can include a distance (e.g., depth or range from the sensor) and an azimuth (e.g., an angle from a reference line or position). A scanning LiDAR sensor may rotate, e.g., about a vertically-oriented axis, to scan the full 360-degrees about the sensor. Accordingly, LiDAR returns associated with a single scan, e.g., returns for a complete rotation around the axis, do not represent the same instant in time. Instead, returns associated with a single scan are varied in time by as much as the time it takes for the sensor to complete the rotation. As a result, LiDAR sensor data may include distortions of objects in the environment resulting from relative movement (either by motion of objects in the environment, the LiDAR sensor, or both). Of course, other types of lidar are contemplated herein (e.g., flash LiDAR, solid state LiDAR, etc.), all of which may be simulated by the techniques described in detail herein. The vehicle control system noted above may be trained to interpret distortions from input LiDAR returns, so simulated LiDAR returns should also include the distortions so that testing and validation in simulated environments more accurately reflects the physical world. Accordingly, techniques described herein can generate simulated LiDAR data, e.g., LiDAR data corresponding to a simulated environment, that includes distortions.

This disclosure is generally directed to apparatuses, systems, and methods for generating simulated LiDAR data, e.g., LiDAR data such as points and point clouds, representative of a simulated environment, such as a simulated driving environment. The simulated LiDAR data may include LiDAR returns representative of returns an actual LiDAR sensor would generate. Example techniques may generate the simulated LiDAR data from environment data, which may be simulated environment data, e.g., generated by a simulation system, actual image and/or sensor data captured by imagers/sensors in an environment, or some combination of the two. By way of non-limiting example, a simulation system can create a simulated environment, which may be based on or replicate aspects of an actual environment, and environment data can include information about the simulated environment. For example, the environment data can include positions, extents, and/or other attributes of objects in and features of the simulated environment. In addition, the environment data can include surface features and/or characteristics of objects in the environment. Because the environment is simulated, e.g., computer-generated, the environment data can include complete information about the environment. For instance, ground truth velocity, position, heading, and the like may be known and/or can be determined for any object or feature, e.g., on a pixel-by-pixel basis, in the simulated environment, at any instant in time. Accordingly, for a given instant, depth (and/or intensity) of any pixel in the environment can be known relative to a focal point of a simulated sensor. However, as discussed above, LiDAR data is not so precise, because it may not scan an entire environment at the same instant. Accordingly, techniques described herein can project or interpolate a single scene, e.g., attributes of the environment at an instant in time, forward in time, to simulate how a LiDAR sensor would capture the scene on a moving platform.

In some examples, systems and techniques described herein can include a depth offset generator that determines projected positions associated with objects, e.g., pixels associated with objects, based on position information contained in the environment data. The projected position can be used to determine simulated depths or ranges for inclusion in simulated LiDAR data. For example, the depth offset generator can determine an optical flow field that represents relative movement in the environment at a given time. The optical flow field can include an optical flow vector for each pixel in the environment. In some examples, the optical flow vector(s) can be based on an instantaneous velocity at that pixel (e.g., a ground truth velocity), known from the environment data. As a non-limiting example, the relative velocity of a point (which may include one or more of motion of the sensor and/or motion of the object in the environment), as well as known depth, may be projected into an image in order to precisely determine what the optical flow for a particular pixel would be. In other examples, the optical flow vector(s) may be determined by comparing environment data associated with a first time to environment data associated with a second time. For example, a difference in position between a feature or pixel at the first time and the same feature or pixel at the second time can be used to determine a relative velocity (e.g., an average relative velocity) of the feature/pixel between the first time and the second time (e.g., in accordance with Lucas-Kanade techniques, or otherwise).

In some examples, the depth offset generator can also associate timestamps with segments or portions of the environment data. For instance, and as described above, a LiDAR sensor may scan an environment as it rotates about an axis coincident with the focal point of the sensor. A complete rotation may be characterized as a scan time or scan interval of the LiDAR sensor. Using the scan time (and/or other parameters of the LiDAR sensor to be simulated), the depth offset generator can associate timestamps with angular offsets about the axis/focal point. In an example in which a LiDAR sensor completes a rotation in 100 ms, each 3.6-degree interval can be associated with 1 ms. Conceptually, two points (or pixels) associated with a same object, and that are 36-degrees apart relative to the focal point, would be scanned by the LiDAR sensor 10 ms apart.

In examples, the depth offset generator can use the optical flow field and the timestamp information to generate updated position data for use in simulated LiDAR returns. For example, each pixel of the environment data can be offset along a direction of an associated optical flow vector by an offset distance. The offset distance may include a first distance associated with the magnitude of the flow vector and a second distance associated with the timestamp information. Regarding the latter, and as in the example above, the depth offset generator will cause points scanned later in time, e.g., based on the direction of rotation of the simulated sensor, to have the effect of being generated later, thus being "acted on" longer by the optical flow vector. In some examples, the updated position data can be used in the simulated LiDAR data. For instance, a depth or range of a simulated return associated with a point can be a distance between the focal point and the updated position, and an azimuth associated with the point can be an angle between a reference line coincident with the focal point and a line extending from the focal point to the updated position.

In addition, simulated LiDAR data can include simulated intensity information. Example techniques may include an intensity value generator. For example, the intensity value generator can include functionality to determine an intensity from surface features or parameters associated with objects in the environment (e.g., material information comprising an amount of specularity, diffusion, BRDFs, BSSDRF, etc.). As detailed herein, the environment data can be generated using simulation or rendering software-based systems. Such systems may include functionality for providing surface finishes, such as colors, textures, and roughness, for providing material composition information, such as metallic or non-metallic, and/or for providing reflectivity information, such as albedo information. In aspects described herein, the intensity value generator may estimate an intensity value using some or all of this information.

According to techniques described herein, the simulated LiDAR data can be embodied as points, e.g., in point clouds, each having position and intensity values. Such simulated LiDAR data can be used to replicate sensor data generated by an actual LiDAR sensor, including distortions caused by relative movement of objects and/or sensor operation, as described herein.

The techniques discussed herein may improve a functioning of a computing device in a number of ways. For example, the techniques discussed herein may include converting global image data into LiDAR data, which may allow use of existing global image data (e.g., stored in a database), once converted, in systems configured to use LiDAR data. For example, existing global image data about an environment may be converted into simulated LiDAR data, so that systems (e.g., navigation and/or control systems) configured to use LiDAR data may be used, which may reduce a need to modify the existing systems. In some examples, generated simulated LiDAR data may render global environment data capable of use for training machine learning models to interpret LiDAR data. In some examples, this may permit the use of new or different LiDAR sensors in applications that previously used other and/or different imagers, such as for example, navigation and/or control functions for autonomous vehicles. In some instances, this may facilitate the use of less complex and/or expensive imagers for use with autonomous vehicles and/or data gathering for creation of virtual maps. In some examples, the functioning of a computer may be improved, as the simulation may rely on optical flow information generated at a single instant, as opposed to performing more expensive operations (such as raycasting) at different positions/times to account for the relative motion of the sensor and objects in the simulated environment. Such an optical flow method may further capture sensor anomalies which may be difficult to model otherwise.

The techniques described herein may be implemented in a number of ways. Example implementations are provided below with reference to the following figures. Although discussed, in some instances, in the context of an autonomous vehicle, the methods, apparatuses, and systems described herein can be applied to a variety of systems (e.g., a robotic platform, manually driven vehicles, etc.), and are not limited to autonomous vehicles. For example, the techniques may be used in an aviation and/or nautical context, and/or in any system using machine vision. Additionally, the techniques described herein may be used with real data (e.g., captured using sensor(s)), simulated data (e.g., generated by a computer and/or simulator), or any combination thereof.

FIG. 1 is a schematic diagram illustrating an example process 100 for generating simulated LiDAR data corresponding to an environment (e.g., a real or synthetic environment). As shown in FIG. 1, a data generator 102 may be used to generate data about the environment. For instance, the data can include information about a scene 104 (shown in a field of view 106 in FIG. 1 from a focal point). The example scene 104 in FIG. 1 includes stationary objects 108 in the background (objects stationary with respect to the surroundings), such as, for example, buildings, telephone poles, trees, the road surface, etc. The stationary objects 108 may be moving with respect to the focal point, for example, if the focal point is associated with a moving object. For instance, in examples described herein, the focal point may be associated with a simulated sensor, such as a LiDAR sensor, an imager (such as a global shutter imager), or the like, and the simulated sensor may be associated with a simulated vehicle driving in the environment represented by the scene 104. In the example shown in FIG. 1, the focal point may be associated with a vehicle 110. (FIG. 1 depicts only a small section of a surface of the vehicle 110.)

The example scene 104 shown in FIG. 1 also includes dynamic objects 112 that are moving relative to the surroundings and relative to the focal point. For example, in the foreground of the field of view 106, a vehicle 114 is passing from left-to-right in the environment. Also in the illustrated scene 104, the vehicle 114, as well as other dynamic objects 112 are represented substantially without distortion. For example, the data generator 102 may be configured to generate data about the environment, as represented by the scene 104. Accordingly, in examples, the entire scene 104 is recorded at (or otherwise representative of the scene at) exactly the same instant in time. Moreover, the field of view 106 may represent only a portion of an entire field of view. In implementations, the field of view may represent 360-degrees around a focal point. Of course, though depicted in FIG. 1 for illustrative purposes as two-dimensional, it is understood that such environmental data may comprise full three-dimensional meshes (or other representations, models, etc.).

As depicted in FIG. 1, the data generator 102 may be configured to generate and/or record environment data 116. In some instances, the environment data 116 can be data descriptive of attributes of the environment. For instance, the data generator 102 can be a software-based engine, e.g., a graphics engine, configured to render elements, features, and/or objects in a synthetic or simulated environment. In such instances, the environment data 116 can include spatial information, e.g., height, width, and/or depth of such elements; positioning in the environment relative to a coordinate system and/or to other objects or positions (e.g., the focal point noted above); heading information, e.g., velocity and/or acceleration; and/or attributes of the elements/objects, e.g., a metallicness, a roughness, a color, a reflectivity, specularity, diffusion, bidirectional reflection distribution function (BRDF), bidirectional scattering-surface reflectance distribution function (BSSRDF), and/or an albedo of elements/objects. In some instances, the data generator 102 can generate data on a per-pixel basis, e.g., for rendering the environment as in the scene 104. In other instances, the environment data 116 can include image data, such as image data captured by an imager, like a global shutter imager.

As shown in FIG. 1, the example process 100 may include communicating the environment data 116 to a simulated LiDAR data generator 118 configured to receive (and/or access) the environment data 116 and, in some examples, receive LiDAR sensor parameters 120 indicative of parameters related to a LiDAR sensor, the output of which is being simulated. For example, a LiDAR sensor may have technical characteristics related to performance, such as, for example, scanning orientation associated with an arrangement of light emitters in the LiDAR sensors (e.g., whether light emitters are horizontally or vertically oriented), a field of view of the LiDAR sensor, a scan or spin rate of the LiDAR sensor, power emission level, sensitivity, light emission frequency, position and/or orientation, or the like. Such characteristics may be inherent to a particular LiDAR sensor and may affect artifacts associated with sensor data captured by the LiDAR sensor and/or present in simulated LiDAR data generated by the simulated LiDAR data generator 118, upon conversion of the environment data 116 into simulated LiDAR data.

As shown in FIG. 1, the simulated LiDAR data generator 118 may include a depth offset generator 122 configured to determine positions of features, objects, or the like, based at least in part on the environment data 116 and/or the LiDAR sensor parameters 120, for example, as explained in more detail herein. In some examples, the simulated LiDAR data generator 118 may also include an intensity value generator 124 configured to generate intensity values related to portions of features, objects, or the like. In some examples, the depths and/or the intensity values may be based at least in part on the environment data 116, the LiDAR sensor parameters 120, and/or an optical flow field, for example, as explained in more detail herein. In some examples, the simulated LiDAR data generator 118 may be configured to generate simulated LiDAR data 126 based at least in part on depths associated with positions generated by the depth offset generator 122, intensity values generated by the intensity value generator 124, and/or the environment data 116. In some examples, the simulated LiDAR data 126 may include point cloud data comprising a plurality of points, each including one or both of position information and intensity information. Such simulated LiDAR data 126 may simulate data that would be generated by a LiDAR sensor having the LiDAR sensor parameters 120, in response to sensing the environment depicted in the scene 104. In examples, the simulated LiDAR data may be stored in memory in a database, processed, reproduced, and/or displayed on a display device.

In more detail, FIG. 1 includes a partial representation 128 of the simulated LiDAR data 126, which is a partial representation of the vehicle 114 from the scene 104. As illustrated, a portion of the simulated LiDAR data 126, in some examples, may be characterized by a plurality of points 130, each having a depth (e.g., a distance from the focal point) and/or an intensity, as explained in more detail herein. For example, as schematically depicted in FIG. 1, the points 130 associated with the vehicle 114, passing from left-to-right in the field of view 106, may cause a distorted (e.g., elongated) representation of the vehicle 114, e.g., because the vehicle 114 is moving relative to the simulated LiDAR sensor. Such distortion may also be indicative of the LiDAR sensor parameters 120. For example, the LiDAR sensor parameters may indicate that the simulated LiDAR sensor emits vertical columns of light sequentially, e.g., at intervals, as the emitter rotates from right-to-left over a period of time, as described herein. Accordingly, the simulated LiDAR data 126 simulates the fact that the LiDAR sensor captures returns based on light emitted over a period of time, in contrast to capturing the entire image at exactly the same time, which information is available when the scene 104 is entirely simulated (e.g., rendered using a graphics engine) and/or if the environment data 116 is image data captured using global shutter imagers.

In the example depicted in FIG. 1, the focal point (e.g., of the simulated LiDAR sensor) may not be moving relative to the stationary objects 108 in the background of the image. Although not illustrated in the partial representation 128, in such a case the stationary objects 108 would substantially not be distorted in the simulated LiDAR data 126 or a representation of the entirety of the simulated LiDAR data corresponding to the scene 104. However, in some examples, if the stationary objects 108 in the background were moving relative to the focal point (e.g., if the vehicle 110 to which a simulated LiDAR sensor is mounted were moving relative to the background with sufficient speed), the stationary objects 108 would, in some examples, be distorted in the simulated LiDAR data 126 relative to the environment data 116 and/or images corresponding to the environment data 116.

Stated differently, in aspects of this disclosure, absolute, or ground truth information about aspects, e.g., pixel values, locations, objects, or the like, may be known from the environment data 116. The environment data 116 can be simulated data, and, accordingly, all objects, positions, attributes, and the like are known for any point in time (because the scene is rendered in a simulation). While the ground truth information may be valuable in some instances, such information may not be representative of actual data captured by a physical sensor. For instance, a rolling shutter camera does not capture all pixels of an image at the same time. Accordingly, a rolling shutter image of a moving object can include blur and/or other artifacts caused by the functionality of the rolling shutter technology. Similarly, a LiDAR sensor may be configured to generate LiDAR data, e.g., point cloud data, about a full 360-degree field of view, but such points are captured and/or readout as the light emitter (and receiver) are spun about a rotational axis. Thus, in an example in which the LiDAR sensor is mounted on a roof of a vehicle, points associated with objects in front of the vehicle are captured at a first time, different from a second time at which returns associated with objects behind the vehicle are captured. Accordingly, the ground truth information provided by a simulation system and/or global images, while accurately depicting an environment, may not accurately depict how a sensor, such as a LiDAR sensor, images the environment. Techniques described herein may generate simulated LiDAR data of the environment, e.g., to better simulate how a LiDAR sensor would image the environment.

Figure 2:
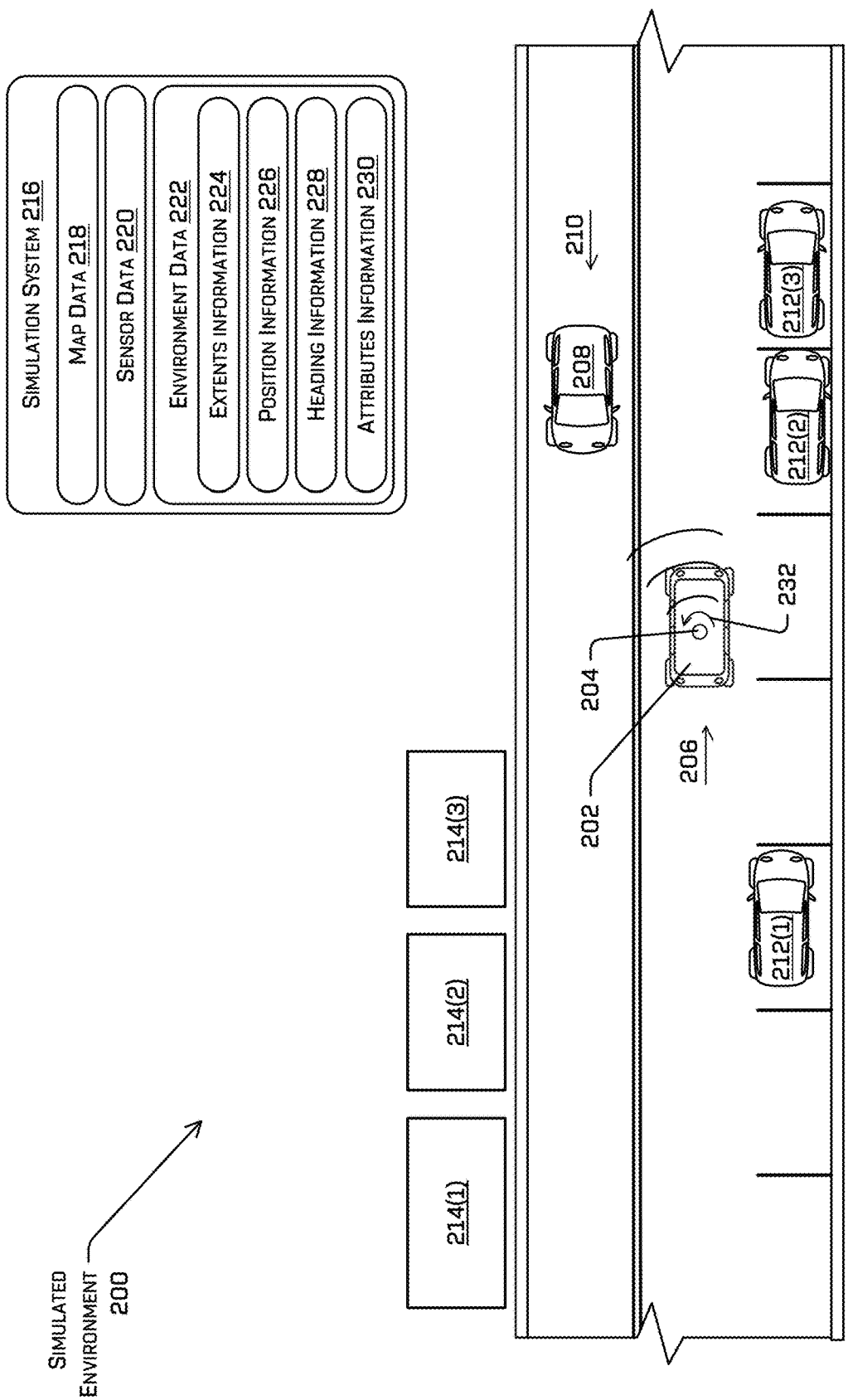
FIG. 2 is a schematic representation of an environment, such as a simulated environment from which techniques described herein can generate simulated LiDAR data, according to examples of this disclosure.

FIG. 2 is a schematic view of an example environment 200. The example environment 200 may be a simulated environment. The example environment 200 will be used to describe additional aspects of this disclosure. Although FIG. 2 illustrates the environment 200 as a two-dimensional environment, in other implementations, the environment 200 may be three-dimensional. In some examples, the environment data 116 may store data representative of the environment 200.

In more detail, the simulated environment 200 simulates a vehicle 202, such as an autonomous vehicle, operating in the environment 200. In aspects of this disclosure, the simulated environment 200 can be used to generate simulation scenarios, e.g., for testing aspects of a control system for an autonomous vehicle. By way of non-limiting example, simulation environments like the environment 200 may allow for controlled testing, e.g., when real world testing is difficult or impractical and/or to supplement real world testing. For instance, by creating simulation scenarios in a simulated environment like the environment 200, vehicle responses to imminent crashes can be determined and evaluated, e.g., without putting vehicles, pedestrians, and other objects in harm's way. Moreover, simulation scenarios can allow for testing of responses of multiple vehicle configurations (e.g., different software versions, sensor configurations, sensor types, or the like) to the exact same scenario. In contrast, re-creating the same scenario multiple times in the real world can be difficult.

In the illustrated example, the vehicle 202 is driving in the environment 200, although in other examples the vehicle 202 may be stationary and/or parked in the environment 200. The vehicle 202 includes one or more LiDAR sensor system(s) 204, which may simulate LiDAR sensors configured to capture data representing the environment 200. By way of example and not limitation, the vehicle 202 can be a simulation of an autonomous vehicle configured to operate according to a Level 5 classification issued by the U.S. National Highway Traffic Safety Administration, which describes a vehicle capable of performing all safety critical functions for the entire trip, with the driver (or occupant) not being expected to control the vehicle at any time. In such an example, since the vehicle can be configured to control all functions from start to stop, including all parking functions, it can be unoccupied. This is merely an example, and the systems and methods described herein can be incorporated into any ground-borne, airborne, or waterborne vehicle, including those ranging from vehicles that need to be manually controlled by a driver at all times, to those that are partially or fully autonomously controlled. Moreover, while examples herein describe using simulated LiDAR data as an input to an autonomous vehicle control system, the techniques described herein can be implemented to generate simulated LiDAR data from environment data, regardless of the use of the LiDAR data.

The vehicle 202 may travel through the environment 200, e.g., generally in the direction shown by arrow 206 relative to one or more other objects. For instance, the environment 200 may include dynamic objects, such as an additional vehicle 208, which is illustrated travelling generally in the direction shown by arrow 210, opposite to the direction of travel of the vehicle 202. The environment 200 may also include static objects, such as a first parked vehicle 212(1), a second parked vehicle 212(2), a third parked vehicle 212(3) (collectively, "the parked vehicles 212"), a first building 214(1), a second building 214(2), and a third building 214(3) (collectively, "the buildings 214"). The additional vehicle 208, the parked vehicles 212, and the buildings 214 are only examples of objects that may be in the environment 200; additional and/or different objects, including but not limited to vehicles, pedestrians, bicyclists, trees, street signs, fixtures, or the like, may also or alternatively be in the environment 200.

As also illustrated in FIG. 2, the environment 200 may be generated or rendered by a simulation system 216. In some examples, the simulation system 216 can include a simulation engine or software engine used to generate the simulated environment 200.

In at least some examples, the simulation system 216 can receive or otherwise access map data 218 and/or sensor data 220. For example, in implementations in which the simulation system 216 is used to render driving environments, like the environment 200, the map data 218 can include information about streets, roads, traffic control devices, crosswalks, and/or the like. The simulation system 216 can also receive or otherwise access sensor data 220. Again, using the example in which the environment 200 is a driving environment, the sensor data 220 can include image data, point cloud data, radar return data, and/or other types of sensor data captured by one or more sensors mounted on a vehicle traversing through an environment. Thus, the sensor data 220 may include data representative of a real-life environment and captured by an actual sensor. In at least some examples, the simulation system 216 can use the map data 218 and/or the sensor data 220 to create and/or re-create aspects of a real-life environment.

As also illustrated in FIG. 2, in some instances the simulation system 216 can also generate or access environment data 222, e.g., to render objects, such as the additional vehicle 208, the parked vehicles 212, the buildings 214, or the like, and/or other aspects of the environment 200. In some examples, the environment data 222 can include extents information 224, position information 226, heading information 228, and/or attributes information 230. The extents information 224 can include sizes, shapes, and/or other spatial information associated with objects to be rendered in the environment 200. By way of non-limiting example, the extents information can be based on statistical models, e.g., generated from the sensor data 220. The position information 226 can include information about a position of rendered objects in the environment 200. The position information 226 can include positions in a coordinate system, e.g., an x-y coordinate system in the two-dimensional environment 200. The heading information 228 can include information about movement of objects in the environment. In the example of FIG. 2, the heading information 228 can include information about a velocity, acceleration, yaw rate, or the like of the additional vehicle 208. The attributes information 230 can include information about attributes of objects in the environment 200. By way of non-limiting example, the attributes information 230 can include information about one or more of e.g., a metallicness, a roughness, a color, a reflectivity, specularity, diffusion, bidirectional reflection distribution function (BRDF), bidirectional scattering-surface reflectance distribution function (BSSRDF), and/or an albedo of elements/objects. The environment data 222 can generally describe aspects of any objects in or aspects of the environment 200. In the context of FIG. 1, any or all of the map data 218, the sensor data 220, and/or the environment data 222 can be included or available as the environment data 116.

As noted above, while the simulation system 216 may be useful to generate synthetic environments, like the environment 200, data corresponding to the environment 200 may not be directly useful to run simulations, e.g., to simulate a response of the vehicle 202 in the environment 200. For instance, while it may be relatively simple to generate a simulated point cloud representative of depths of objects relative to the LiDAR sensors, e.g., because the positions and extents are known from the environment data 222 at a specific point in time, e.g., for a given rendering, such a point cloud would not accurately simulate LiDAR data generated by the LiDAR sensor system(s) 204. For instance, many LiDAR sensors may not be capable of instantaneously capturing a full 360-degrees of data about the sensor. Instead, some LiDAR sensors emit light as they rotate or spin about an axis. By way of non-limiting example, the LiDAR sensor system(s) 204 is illustrated as rotating in a counter-clockwise direction, generally as shown by the arrow 232. In some instances, it may take on the order of about 100 ms for a light emitter to rotate about the axis, such that, in the example of the environment 200, the LiDAR sensor system(s) 204 may detect the additional vehicle 208 at a first time, but may detect the first parked vehicle 212(1) one half revolution (e.g., 50 ms continuing the example) later. During that time lapse, the vehicle 202 (and thus the LiDAR sensor system(s) 204) as well as objects in the environment may have moved significantly.

Because of the sensor parameters just discussed (e.g., rotational scanning) and/or any relative motion between the sensor and objects in the environment, LiDAR data generated of a real-world environment corresponding to the environment 200 will have errors (e.g., relative to the actual environment). By way of illustration and not limitation, a LiDAR sensor positioned as the LiDAR sensory system(s) 204 would generate a point cloud representing the additional vehicle 208 as elongated relative to a reference (physical) length of the additional vehicle 208, e.g., because of the time gap between sensing the trailing edge of the additional vehicle 208 and the leading edge of the additional vehicle 208. Moreover, this elongation would be amplified when the additional vehicle 208 and the vehicle 202 are moving in the illustrated directions. Vehicle computing systems are configured to receive and process data with these errors. Accordingly, LiDAR data simulated according to techniques described herein can include these errors, e.g., to provide vehicle computing systems with data that closely replicates actual sensor data.

Figure 3:
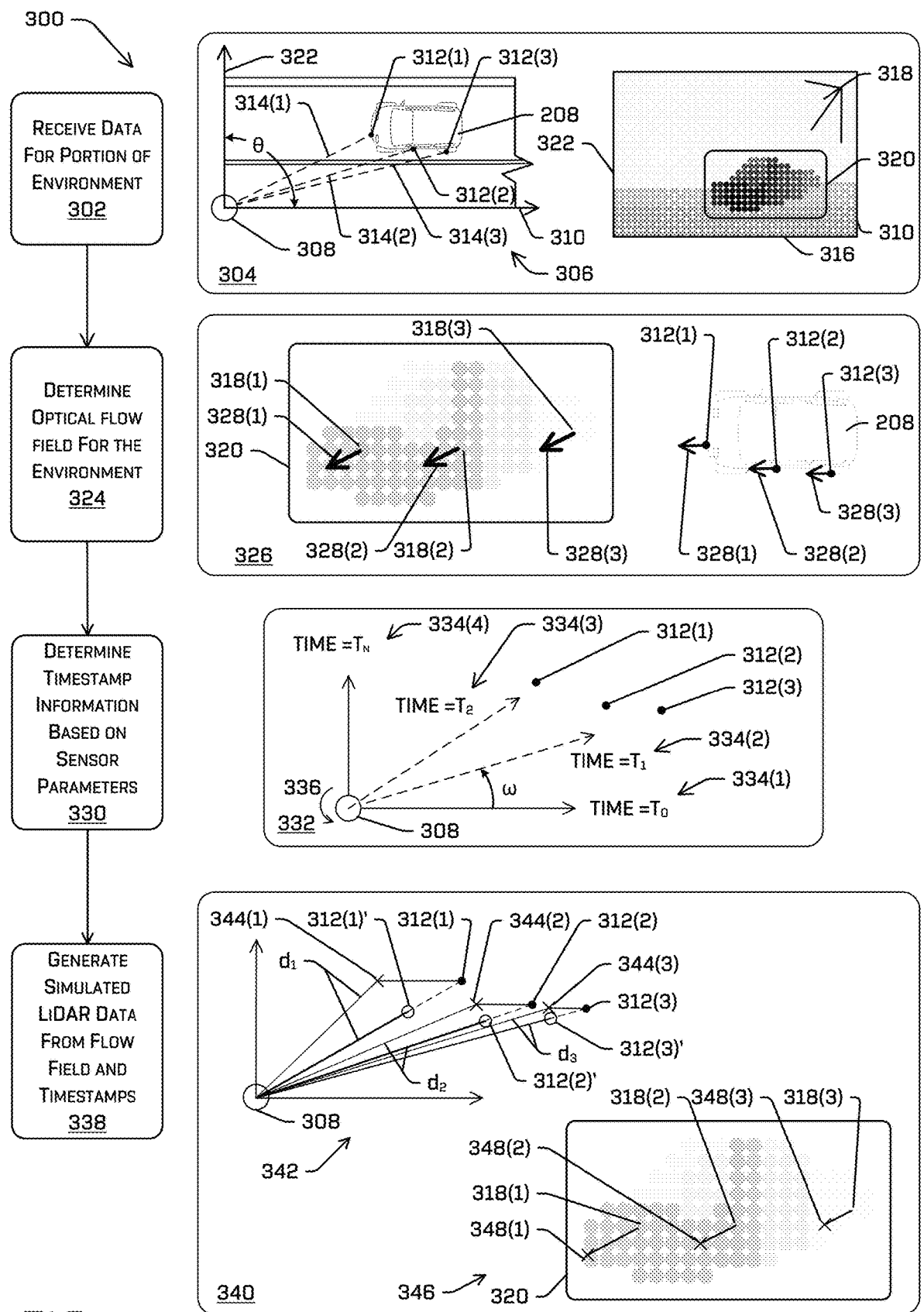
FIG. 3 includes textual and visual flow diagrams that describe and illustrate a process for generating simulated LiDAR data from environment data, according to examples of this disclosure.

FIG. 3 illustrates details of techniques for generating LiDAR data. More specifically, FIG. 3 includes textual and visual flow charts illustrative of a process 300 for generating simulated LiDAR data using an optical flow field.

In more detail, the process 300 can include, at operation 302, receiving data for at least a portion of an environment. In the example 304 accompanying the operation 302, a portion 306 of the environment 200 (from FIG. 2, and described above) is illustrated. More specifically, the portion 306 corresponds to a 90-degree field of view about a simulated focal point 308. For example, the focal point 308 may correspond to a focal point of the LiDAR sensor system(s) 204 and the field of view of the portion of the scene to be simulated may extend angularly from a reference line 310 by an angle θ to a termination line 322. In the illustrated example, the angle θ is 90-degrees and extends in the counter-clockwise direction. However, and as will be appreciated from the following discussion, in other implementations the field of view (e.g., the angle θ) and/or the direction of rotation may be varied. For instance, the field of view may be any non-zero angle. As will be discussed in detail below, the choice of angle may correspond to a trade-off between accuracy and time of simulation.

In FIG. 3, the field of view corresponds to the portion of the environment 200 that includes the additional vehicle 208. As described herein, the environment data received at the operation 302 may be the environment data 116 and may include information about the additional vehicle 208, as well as information about any or all additional objects or aspects in the field of view. For instance, some attributes of the additional vehicle 208 are illustrated by points 312(1), 312(2), 312(3) (collectively, "the points 312") in FIG. 3. In more detail, each of the points 312 may be associated with a portion of the additional vehicle 208. Each of the points 312 may have a position in the environment, e.g., relative to an x, y coordinate system, or, as illustrated, relative to the focal point 308. Specifically, in the example 304, the first point 312(1) can be represented as a depth relative to the focal point 308, e.g., a distance from the focal point 308 along a first direction 314(1). Similarly, the second point 312(2) can be represented as a depth relative to the focal point 308 (e.g., a distance from the focal point 308 along a second direction 314(2)) and the third point 312(3) can be represented as a depth relative to the focal point 308 (e.g., a distance from the focal point 308 along a third direction 314(3)). In the example, the position of each of the points 312 can be represented as the depth and an azimuth angle, e.g., relative to the reference line 310.

The depth and azimuth measurements associated with each of the points 312 can be used to generate simulated LiDAR data. For instance, LiDAR sensors generate point clouds of points, with each point generally including a depth and an azimuth angle to describe the position of the object or surface that reflected light received back at the sensor as LiDAR returns. Thus, in the example 304, the points 312 can correspond to LiDAR returns when the focal point 308 is fixed and the additional vehicle 208 is fixed. However, and as discussed above, the additional vehicle 208 and/or the focal point 308 may be moving. Such movement can cause a LiDAR sensor having the focal point 308 to generate point cloud data including points having different depths relative to the points 312. Moreover, the LiDAR sensor may not capture returns for a full 360-degree field of view instantaneously. The spinning of the LiDAR sensor may also cause positions of returns to vary from the points 312.

The schematic of the portion 306 of the environment is provided to conceptualize the depth and azimuth angles in a top-down view of the environment. As noted above, the environment data may be generated by a simulations system, and in examples, the depths may be obtained from a depth buffer, e.g., containing depth information about the environment. For instance, the example 304 also includes a raster image 316 corresponding to the portion 306 that visualizes depth information for the portion 306. More specifically, the raster image 316 is a two-dimensional image of the portion 306 containing an array of pixels 318 and generated from the point of view of the focal point 308, wherein each pixel of the raster image 316 stores a corresponding depth in the scene. The raster image is bounded on the right by an edge corresponding to the reference line 310 and on the left by an edge corresponding to the termination line 322. The height of the raster image 316 is a dimension normal to the top-down schematic also included in the example 304, and discussed above. Each of the pixels contains information about the environment. In the illustration, the raster image 316 visualizes depth information, e.g., with lighter pixels being farther away and darker pixels being relatively closer. In the raster image 316, a portion 320 corresponds to the additional vehicle 208. In at least some examples, such a raster image 316 may be determined based on graphics hardware optimized to determine such a depth image (e.g., a graphics processing unit).

At the operation 324, the process 300 can also include determining an optical flow field for the environment. For example, the optical flow field may include optical flow vectors representative of movement in an image, such as the raster image 316. In some examples, the vectors can describe velocity on a per-object, per-object segment, per-point, or per-pixel basis. An example 326 accompanying the operation 324 shows the portion 320 of the raster image 316. For clarity, the pixels 318 are lightened and the portion 320 is enlarged relative to the example 304. The portion 320 also illustrates a first optical flow vector 328(1) indicative of a velocity of a first pixel 318(1) of the pixels 318, a second optical flow vector 328(2) indicative of a velocity of a second pixel 318(2) of the pixels 318, and a third optical flow vector 328(3) indicative of a velocity of a third pixel 318(3) of the pixels 318. The first optical flow vector 328(1), the second optical flow vector 328(2), and the third optical flow vector 328(3) may be collectively referred to herein as the optical flow vectors 328. Although only three optical flow vectors 328 are shown in the example 326, an optical flow vector may be associated with every pixel in the portion 320 of the image 316 (and with every pixel in the entirety of the raster image 316). In the example 326, because each of the pixels 318(1), 318(2), 318(3) is associated with the same object, e.g., the additional vehicle 208, the optical flow vectors 328 associated with each of the points may be substantially the same (however, because of the perspective and relative movement, the flow vectors 328 associated with relatively closer pixels may be slightly higher in magnitude and/or have differing directions than those associated with pixels relatively farther away, despite a uniformly moving rigid object). Thus, for example, the second optical flow vector 328(2) may have a slightly higher magnitude than the third optical flow vector 328(3). In some examples, the optical flow vectors 328 may be relative to the focal point. Thus, when the focal point 308 is stationary, e.g., when the sensor having the focal point 308 is not moving, the optical flow vectors 328 can represent an absolute or ground truth velocity of the additional vehicle 208. Alternatively, when both the additional vehicle 208 and the sensor are moving, as in the environment 200 of FIG. 2, the optical flow vectors 328 can be representative of this relative movement. In the example, pixels associated with the background or the driving surface may have associated optical flow vectors indicative of the relative movement of the sensor, e.g., despite being "stationary" in the environment.

In examples in which the environment 200 (and thus the portion 306 of the environment) are synthetic or simulated, the velocity of each object (and therefore each point or pixel) can be known, e.g., as ground truth information. Accordingly, an optical flow field at any instant in time can be readily discerned from the environment data received at the operation 302. In examples, the rasterization can be used to render into a depth buffer and the depth buffer may be used to compute the optical flow. In other instances, techniques described herein may otherwise generate the optical flow field. For example, the operation 324 can include comparing attributes of the environment at different times in a time period and calculate the optical flow vectors 328 based on changes over the time period. In at least one example, the environment data received at the operation 302 can include global image data of at least a portion of the environment, e.g., the portion 306. For instance, the global image data can be image data captured by an imager or simulated global image data. Successive instances of the global image data, e.g., captured at successive, predetermined time intervals, may then be compared to determine the optical flow vectors 328. For instance, a position of a first feature can be identified in each of the images and compared to determine a change over the time. In still further examples, e.g., in which the environment data is simulated data, successive frames, e.g., in frame buffers of a renderer, may be compared to determine the optical flow vectors (such as, for example, using Lucas-Kanade style techniques).

The example 326 also includes a schematic that conceptualizes the optical flow vectors 328 on the additional vehicle 208. As illustrated, the first optical flow vector 328(1) can be associated with the first point 312(1), the second optical flow vector 328(2) can be associated with the second point 312(2), and the third optical flow vector 328(3) can be associated with the third point 312(3). The flow vectors 328 may have a direction generally in the direction of travel of the additional vehicle 208. In at least some examples where a three-dimensional relative velocity is known (as may be determined based on the simulation), the environmental velocity vectors may be projected into the image in order to determine the optical flow.

At operation 330, the process 300 can also include determining timestamp information based on sensor parameters. For example, LiDAR sensors generally operate by emitting light and receiving the light upon reflecting off of objects in the environment, like the additional vehicle 208. The depth of the object, e.g., a distance from the sensor, can then be determined based on a time it takes for the emitted light to reflect off the object and be received back at the sensor. Thus, in LiDAR sensors, returns are generated only for areas contacted by the emitted light. Accordingly, some LiDAR sensors can rotate or otherwise move to vary the direction of the emitted light. In at least some examples, a LiDAR sensor can be configured to rotate, e.g., about the focal point 308. In an example 332 accompanying the operation 330, a direction of rotation of a simulated LiDAR sensor is shown by an arrow 336. In addition to the direction of rotation, the LiDAR sensor parameters may also include a rate of rotation along the arrow 3336. Additional LiDAR sensor parameters can also include an intensity and/or wavelength of light emitted by the LiDAR sensor. The sensor parameters can also include information about additional motion of the simulated LiDAR sensor in the environment. For instance, in the context of the environment 200 in which the simulated LiDAR sensor is associated with the vehicle 202 and the vehicle is moving, the motion of the LiDAR sensor can be expressed as a velocity in a direction of travel. In aspects, any parameter associated with the LiDAR sensor that would impact returns generated by the sensor can be used at the operation 330.

Specifically, the operation 330 can associate timestamp information with angular offsets ω relative to the reference line 310, e.g., over the field of view, to simulate the movement of the sensor according to the arrow 336. For example, as shown in FIG. 3, first timestamp information 334(1) has been associated with the reference line 310, second timestamp information 334(2) has been associated with a first offset angle (about the focal point 308), third timestamp information 334(3) associated with a second offset angle (about the focal point 308), and fourth timestamp information 334(4) associated with a third offset angle coincident with the extent or boundary of the portion 306. The timestamp information is based on the LiDAR sensor parameters discussed above. For example, the timestamps may be calculated based on the size of the portion 306 and the spin rate of the light emitter of the sensor. Consider a non-limiting example in which a LiDAR sensor completes a full revolution about the focal point 308 in 100 ms. In this example, the 90-degree field of view shown in the example 332 would correspond to 25 ms. Thus, the first timestamp information 334(1) may represent an initial time $T_0$ and the example fourth timestamp information 334(4) may represent a time $T_4$ that is 25 ms after the initial time $T_0$. In this example, the second timestamp information 334(2) and the third timestamp information 334(3) may be associated with times between 0 and 25 ms, based on the angular offset ω. As discussed above, the field of view (e.g., 90-degrees in FIG. 3) can be varied, which, like the scan rate and/or other aspects of the LiDAR sensor, can further alter the timestamps.

In some examples, the timestamp information 334 may also be used for associating a time with the angular offsets of the simulated LiDAR data 126. Such techniques may be useful for additional image data processing processes and/or or for synchronizing the simulated LiDAR data 126 with other time-dependent operations associated with the simulated LiDAR data 126, such as, for example, fusing of data obtained from other sensors (e.g., imagers, other LiDAR sensors, radio detection and ranging (RADAR) sensors, or sound navigation and ranging (SONAR) sensors).

At operation 338, the process 300 can include generating simulated LiDAR data from the optical flow field and the timestamps. For example, the operation 338 can use the optical flow field to estimate a depth of a given point at some time in the future using the timestamp information, e.g., by projecting a point or pixel along its associated flow vector for a time that is the difference between the timestamp associated with the position of the point in the field of view (the angle ω) and the time $T_0$. An example 340 accompanying the operation 338 illustrates this conceptually. Specifically, the example 340 includes a schematic 342 that shows a first simulated point 344(1), a second simulated point 344(2), and a third simulated point 344(3) representative, respectively, of the first point 312(1), the second point 312(2), and the third point 312(3). More specifically, in the example 338, the timestamp information 334 and the optical flow vectors 328 may be used to project points associated with a known instant in time forward in time, e.g., to re-locate information associated with a particular point or pixel (or group of pixels). Conceptually, in the example of FIGS. 2 and 3, because a LiDAR sensor like the LiDAR sensor system(s) 204 on the vehicle 202 is spinning in the direction of the arrow 336, it would generate a return associated with a location on the additional vehicle 208 proximate the third point 312(3), e.g., proximate a rear of the additional vehicle 208, earlier in time than it would generate a return associated with a location on the additional vehicle 208 proximate the first point 312(1), e.g., proximate a front of the additional vehicle 208. Over the elapsed time, the position of the additional vehicle 208 (and/or of the LiDAR sensor) may have changed, so techniques described herein can project attribute changes based on such relative movement.

In the example 340, the first simulated point 344(1) is farther from the first point 312(1) than the second simulated point 344(2) is from the second point 312(2). Similarly, the second simulated point 344(2) is farther from the second point 312(2) than the third simulated point 344(3) is from the third point 312(3). As will be appreciated, these offsets are the result of the relative movement of the vehicles (characterized by the optical flow field), as well as the operation (rotation) of the LiDAR sensor. In the example, the first simulated point 344(1) is a first distance $d_1$ from the focal point 308. Notably, the distance $d_1$ is different from a distance between the focal point 308 and the first point 312(1). In the example, the distance $d_1$ is less than the distance of the first point 312(1) from the focal point 308, e.g., because the additional vehicle 208 will have gotten closer to the sensor between $T_0$ and $T_2$. In this example, then, the distance $d_1$ can be used to estimate a depth associated with the point 312(1), e.g., at the same azimuth angle as the first point 312(1). This is shown in the schematic 342 as a first simulated LiDAR point 312(1)'. Specifically, simulated LiDAR data generated according to this disclosure can include the first simulated LiDAR point 312(1)' characterized by the first depth $d_1$ at the azimuth angle associated with the point 312(1). Similarly, the second point 312(2) can be projected (in accordance with the second optical flow vector 328(2)) to a second simulated point 344(2) and the third point 312(3) can be projected (in accordance with the third optical flow vector 328(3)) to a third simulated point 344(3). Respective depths $d_2$, $d_3$ associated with the second simulated point 344(2) and the third simulated point 344(3) can be used as depths associated with second and third simulated LiDAR points 312(2)', 312(3)'.

The example 340 also includes an image 346 illustrating the concept using the portion 320 of the raster image 316. Specifically, each of the first pixel 318(1), the second pixel 318(2), and the third pixel 318(3) is projected (along the associated optical flow vector 328(1), 328(2), 328(3)) a distance associated with respective time (e.g., based on the timestamps) to projected points 348(1), 348(2), 348(3)

(which may correspond to the simulated points 344(1), 344(2), 344(3)). As illustrated, each of the projected points 348(1) can be associated with a different one of the pixels 318, and the depth value associated with that new pixel can be used as a depth for a LiDAR point associated with the respective pixels 318(1), 318(2), 318(3). In some examples, the depth value can be determined as a closest pixel, an average of a number of neighboring pixels, or otherwise.

As just described, depth buffer information, optical flow vectors, and timestamp information can be used to estimate a depth of a point or pixel to generate LiDAR data representative of a simulated environment.

In the illustrated example, because each of the points 312 is associated with the same object, e.g., the additional vehicle 208, the optical flow field vectors associated with each of the points 312 may be substantially the same. Accordingly, in the example, the different distances between the respective points 312 and associated simulated points 344 illustrates the different rotational positions of the simulated LiDAR sensor, as determined by the time stamps 334. Of course, different objects in the environment will have different optical flow vectors and thus simulated points associated with such objects could be at different lengths (and positions) from their associated points. Like real LiDAR sensors, the simulated LiDAR data generated in accordance with the process 300 will result in distortion of objects, because of movement. As will also be appreciated, such distortion may be greater or more pronounced at positions closer to the (simulated) sensor.

In the example 340, the points 312 and pixels 318 are projected forward in time, e.g., using the optical flow vectors to determine where a point will be in the future. However, this technique may result in incomplete information, e.g., because pixels associated with the leading edge (e.g., to the left in the figures) will be projected to a position (e.g., like the positions associated with the simulated points 344 and the projected points 348) in front of the vehicle. Thus, such projections may result in a point off the vehicle, which will return an inaccurate depth. Other techniques may remedy these deficiencies. For example, some implementations can instead project backward in time, e.g., by generating flow vectors in the opposite direction of those shown, and applying the timestamps in reverse. Other examples can include a combination of the two, e.g., by using both backward and forward-looking techniques and combining the results, e.g., by using averaging techniques, removing outliers, and/or other processing techniques.

As will be appreciated, the additional vehicle 208 may be distorted in the simulated LiDAR data 126. That is, points representative of the additional vehicle may be visualized as an elongated vehicle, e.g., like in the partial representation 128 of FIG. 1. Because of the relative movement of the additional vehicle 208 and the vehicle 202, as well as the direction of rotation of the LiDAR sensor, a LiDAR sensor in a real-life environment corresponding to the simulated environment 200 would generate returns similar to the simulated LiDAR returns 34i. Stated differently, because the raster image 316 is associated with a specific instant in time, and the LiDAR sensor would not scan the entirety of the raster image 316 in that instant, the techniques described herein estimate where points or pixels will be over the time it takes to scan the area of the raster image 316. In some instances, an estimation error corresponding to differences between returns from a real-life environment and the simulated environment 200 can be altered through selection of the angle θ, e.g., by changing the width of the rasterized image 316. For instance, when the angle θ (and the width of the rasterized image 316) is relatively smaller, the amount of time over which the points may be projected (e.g., using the timestamps) is reduced. Conversely, if the angle θ (and the width of the rasterized image 316) is relatively larger, the amount of time over which the points may be projected is enlarged. Theoretically, if the angle θ (and thus the width of the rasterized image 316) were equal to a width of the column of light emitted by the LiDAR sensor, each point in that (minimal) field of view would have accurate depth information, e.g., would not need to be projected. Thus, in some examples in which rasterized images can be generated at very small timesteps, simulated LiDAR data could be generated directly from ground truth information. However, accessing the depth buffer and rasterizing at such a high frequency can be computationally expensive. In contrast, as the angle θ is increased, e.g., up to 360-degrees, some points must be projected further in time to obtain corresponding simulated LiDAR data, e.g., up to a time it takes the light emitter in the LiDAR sensor to complete a spin (as indicated by the LiDAR sensor parameters 120). However, increasing the angle θ can greatly reduce computational cost, e.g., because the depth buffer and rasterization are accessed less frequently, but accuracy can be greatly diminished, as the environment can change drastically. As will be appreciated, then, the size (e.g., width) of the portion 306 chosen at the operation 302 may impact attributes of the techniques described herein. In some implementations, when simulating returns from a 360-degree LiDAR sensor, a portion of from about 90-degrees to about 120-degrees may provide adequate estimates at a reasonable cost, although other size segments may alternatively be used.

From the foregoing, FIG. 3 illustrates and describes a process 300 by which simulated LiDAR data may be generated from a scene captured or generated at some instant in time. According to the techniques of FIG. 3, locations of points may be projected using optical flow fields and timestamps to determine simulated points having a depth and azimuth, as generated by conventional LiDAR systems. Such simulated LiDAR data may be used for several purposes, including but not limited to simulating objects for an autonomous vehicle control system. Some conventional LiDAR systems also generate intensity information. In some examples, simulated LiDAR data generated in accordance with techniques herein may also include intensity information, e.g., using the intensity value generator 124. For instance, the intensity value generator may receive intensity information (e.g., intensity values) as part of the environment data and/or may associate a predetermined intensity value with simulated LiDAR returns. In at least some examples, an intensity value for points associated with an object may be estimated by the intensity value generator 124, e.g., based on an identification of a type of the object with which the simulated return is associated.

Figure 4:
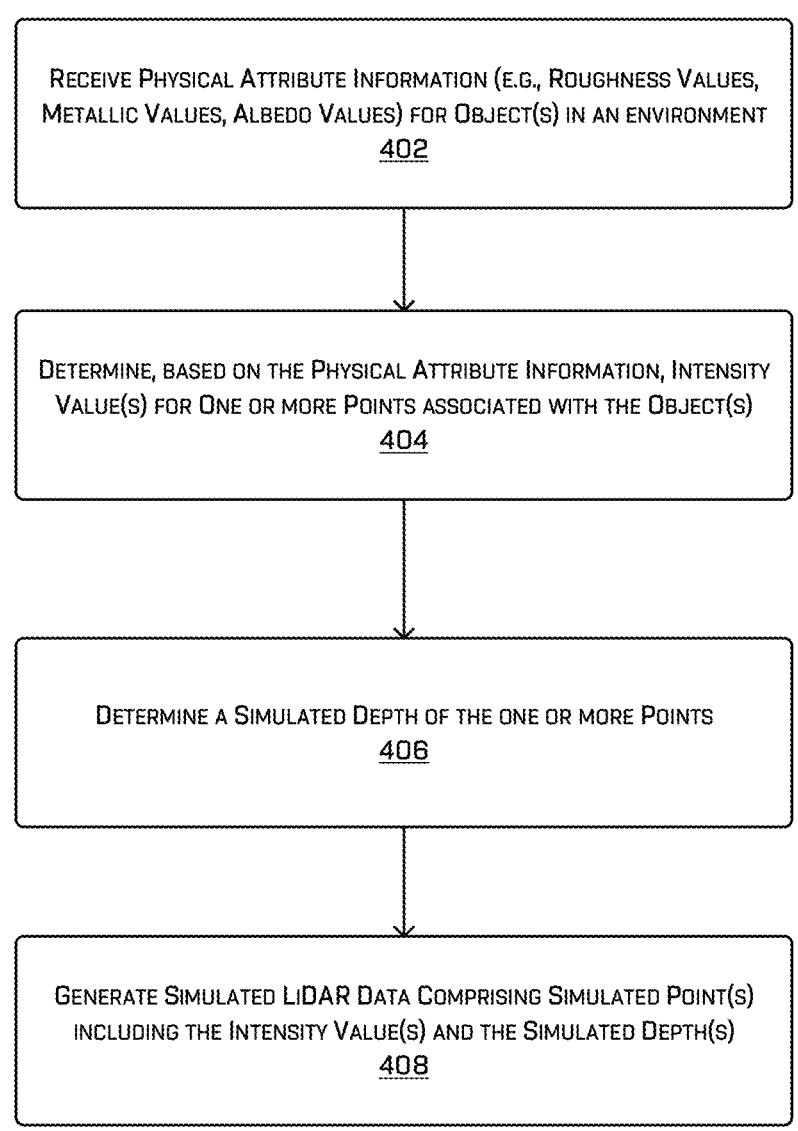
FIG. 4 is a flow diagram of an example process for estimating intensity values from physical properties of an object and generating simulated LiDAR data including such intensity values and the location of such object, according to examples of this disclosure.

FIG. 4 is a block diagram of an example process 400 for generating intensity values and associating such values with locations as simulated LiDAR data. In some examples, at least a portion of the process 400 may be performed by the intensity value generator 124, although the process 400 is not limited to being performed, in whole or in part, by the intensity value generator 124. Moreover, the intensity value generator 124 is not limited to performing the process 400.

At operation 402, the process 400 can include receiving physical attribute information for one or more objects in an environment. For example, the physical attribute information may include roughness values and/or values related to how metallic an object is. Also in examples, the physical attribute information can include color information, including but not limited to albedo information, such as information about an albedo mesh for a scene. As described herein, example techniques generate simulated LiDAR data from environment data 116, which may be information about an environment such as the simulated environment 200. Also in examples, the simulated environment 200 may be created using a software-based rendering engine such as the simulation system 216. Such engines can include functionality to define surface characteristics of objects, which definitions may be stored as values in one or more channels. At least one conventional graphics engine provides functionality to define how metallic an object is, how rough a surface of the object is, albedo values associated with the object, and/or other information. In at least some examples, such information can be included in one or more channels of image data associated with objects in the simulated environment 200. Moreover, such information may be on a per-pixel basis.

At operation 404, the process 400 can include determining, based on the physical attribute information, one or more intensity values for one or more points associated with the object. For example, an intensity value for a specific pixel may be generated as a function of one or more of the attribute values received at the operation 402 for that pixel. In one example, a pixel having a relatively high metallicness and a relatively low roughness would be expected to be more reflective than a pixel having a relatively lower metallicness and a relatively higher roughness. For example, rougher materials may scatter light more readily and non-metallic materials may absorb more light. In some instances, the relationship between metallicness and roughness can be defined as a single value, which may be pre-determined. In some implementations, the intensity value generator 124 may include and/or access a look up table storing values based on the metallicness and the roughness. In examples, the function can multiply the value by an albedo red value. For instance, an albedo map may be used to define the proportion of incident light reflected away from a surface, e.g., at individual pixels. Albedo maps may apply to only a single color channel, which may be the red channel in this example. In other examples, an albedo map may be applied to other channels, and such values can also or alternatively be used herein. In at least some example, an albedo map may be produced which is specific to LiDAR wavelengths (e.g., 950 nm, 1550 nm, etc.). The function used in the operation 404 may also include an attenuation term. For instance, the attenuation term may act as an error term that reduces the intensity value, e.g., to account for other factors, including but not limited to a distance of the object from the focal point, an impact of other light sources, and/or other considerations. In examples, the operation 404 may determine the intensity as a fraction of the light emitted by a simulated sensor, as defined by the LiDAR sensor parameters 120.

At operation 406, the process 400 can include determining a simulated depth of the one or more points. For example, the operation 406 can include techniques described above in connection with FIG. 3 to project points in a simulated environment based on LiDAR sensor parameters and relative movement within a scene. For instance, the simulated location may include a range and azimuth.

At operation 408, the process 400 can include generating simulated LiDAR data comprising one or more simulated points including the one or more simulated intensity values and the one or more simulated depth. For example, the operation 408 can include associating the simulated intensity values determined at the operation 404 with the projected depths determined by the operation 406. Accordingly, a simulated LiDAR data may include a number of points, e.g., point clouds, that simulate returns at a sensor in an environment.

Figure 5:
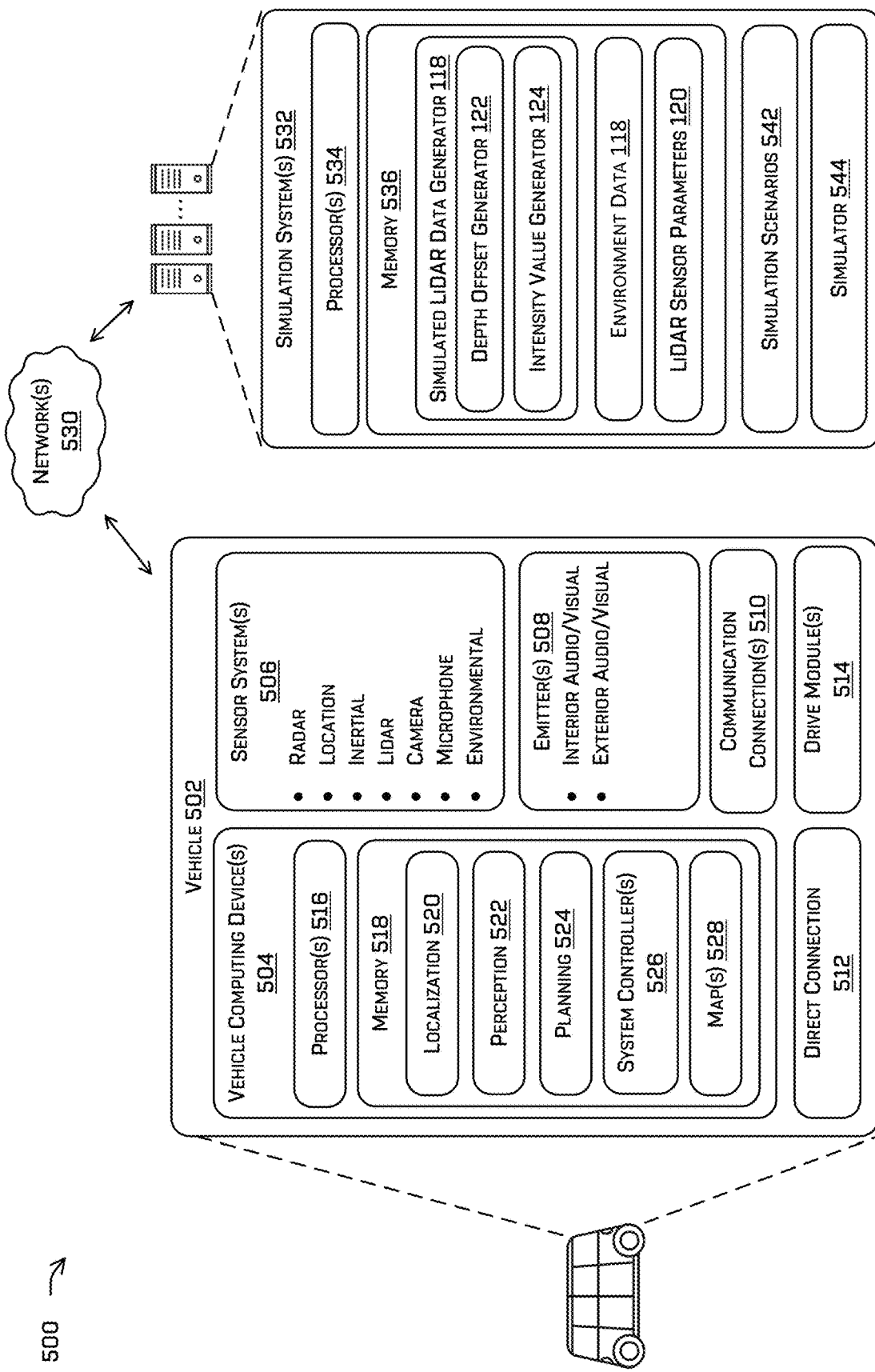
FIG. 5 is a schematic block diagram for implementing simulated LiDAR generation techniques, according to examples of this disclosure.

FIG. 5 depicts a block diagram of an example system 500 for implementing the techniques described herein. In at least one example, the system 500 can include a vehicle 502, which be an autonomous vehicle such as autonomous vehicles described herein. The vehicle 502 can include a vehicle computing device 504, one or more sensor systems 506, one or more emitters 508, one or more communication connections 510, at least one direct connection 512, and one or more drive modules 514.

The vehicle computing device 504 can include one or more processors 516 and memory 518 communicatively coupled with the one or more processors 516. In the illustrated example, the vehicle 502 is an autonomous vehicle; however, the vehicle 502 could be any other type of vehicle, or any other system that receives, generates, and/or otherwise uses LiDAR data. In the illustrated example, the memory 518 of the vehicle computing device 504 stores a localization component 520, a perception component 522, a planning component 524, one or more system controllers 526, and one or more maps 528. Though depicted in FIG. 5 as residing in memory 518 for illustrative purposes, it is contemplated that the localization component 520, the perception component 522, the planning component 524, the one or more system controllers 526, and the one or more maps 528 may additionally, or alternatively, be accessible to the vehicle 502 (e.g., stored remotely).

In at least one example, the localization component 520 can include functionality to receive data from the sensor system(s) 506 to determine a position of the vehicle 502. For example, the localization component 520 can include and/or request/receive a map of an environment and can continuously determine a location of the autonomous vehicle within the map. In some instances, the localization component 520 can utilize SLAM (simultaneous localization and mapping) or CLAMS (calibration, localization and mapping, simultaneously) to receive image data, LiDAR data, radar data, IMU data, GPS data, wheel encoder data, and the like to accurately determine a location of the autonomous vehicle. In some instances, the localization component 520 can provide data to various components of the vehicle 502 to determine an initial position of an autonomous vehicle for generating a candidate trajectory.

In some instances, the perception component 522 can include functionality to perform object detection, segmentation, and/or classification. In some examples, the perception component 522 can provide processed sensor data that indicates a presence of an entity that is proximate to the vehicle 502 and/or a classification of the entity as an entity type (e.g., car, pedestrian, cyclist, animal, building, tree, road surface, curb, sidewalk, unknown, etc.). In additional and/or alternative examples, the perception component 522 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

In general, the planning component 524 can determine a path for the vehicle 502 to follow to traverse through an environment. For example, the planning component 524 can determine various routes and trajectories and various levels of detail. For example, the planning component 524 can determine a route to travel from a first location (e.g., a current location) to a second location (e.g., a target location). For the purpose of this discussion, a route can be a sequence of waypoints for travelling between two locations. As non-limiting examples, waypoints include streets, intersections, global positioning system (GPS) coordinates, etc. Further, the planning component 524 can generate an instruction for guiding the autonomous vehicle along at least a portion of the route from the first location to the second location. In at least one example, the planning component 524 can determine how to guide the autonomous vehicle from a first waypoint in the sequence of waypoints to a second waypoint in the sequence of waypoints. In some examples, the instruction can be a trajectory, or a portion of a trajectory. In some examples, multiple trajectories can be substantially simultaneously generated (e.g., within technical tolerances) in accordance with a receding horizon technique.

The system controller(s) 526 can be configured to control steering, propulsion, braking, safety, emitters, communication, and other systems of the vehicle 502. The system controller(s) 526 can communicate with and/or control corresponding systems of the drive module(s) 514 and/or other components of the vehicle 502.

The map(s) 528 can be used by the vehicle 502 to navigate within the environment. For the purpose of this discussion, a map can be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map can include, but is not limited to: texture information (e.g., color information (e.g., RGB color information, Lab color information, HSV/HSL color information), and the like), intensity information (e.g., LiDAR information, RADAR information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map can include a three-dimensional mesh generated using the techniques discussed herein. In some instances, the map can be stored in a tiled format, such that individual tiles of the map represent a discrete portion of an environment, and can be loaded into working memory as needed. In some example, the vehicle 502 can be controlled based at least in part on the map(s) 528. That is, the maps 528 can be used in connection with the localization component 520, the perception component 522, and/or the planning component 524 to determine a location of the vehicle 502, identify objects in an environment, and/or generate routes and/or trajectories to navigate within an environment. Moreover, data from the sensor system(s) 506 and/or other data can be used to augment, supplement, and/or generate map data included in the map(s) 528.

In some examples, the map(s) 528 may be stored on a remote computing device, e.g., accessible via one or more networks 530. In some examples, multiple of the map(s) 528 may be stored based on, for example, a characteristic (e.g., type of entity, time of day, day of week, season of the year, etc.). Storing multiple maps 528 may have similar memory requirements, but increase the speed at which data in a heat map may be accessed.

In some instances, aspects of some or all of the components discussed herein may include any models, algorithms, and/or machine learning algorithms. For example, in some instances, the components in the memory 518 (and those in the memory 536, discussed below) may be implemented as a neural network.

As described herein, an exemplary neural network is a biologically inspired algorithm which passes input data through a series of connected layers to produce an output. Each layer in a neural network may also comprise another neural network, or may comprise any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

Additional examples of architectures include neural networks such as ResNet70, ResNet101, VGG, DenseNet, PointNet, and the like.

In at least one example, the sensor system(s) 506 can include LiDAR sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 506 can include multiple instances of each of these or other types of sensors. For instance, the LiDAR sensors can include individual LiDAR sensors located at the corners, front, back, sides, and/or top of the vehicle 502. As another example, the camera sensors can include multiple cameras disposed at various locations about the exterior and/or interior of the vehicle 502. The sensor system(s) 506 can provide input to the vehicle computing device 504. Additionally, or alternatively, the sensor system(s) 506 can send sensor data, via the one or more networks 530, to the one or more computing device(s) at a particular frequency, after a lapse of a predetermined period of time, in near real-time, etc.

The emitter(s) 508 may be configured to emit light and/or sound. The emitter(s) 508 in this example can include interior audio and visual emitters to communicate with passengers of the vehicle 502. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 508 in this example also include exterior emitters. By way of example and not limitation, the exterior emitters in this example can include lights to signal a direction of travel or other indicator of vehicle action (e.g., indicator lights, signs, light arrays, etc.) and/or one or more audio emitters (e.g., speakers, speaker arrays, horns, etc.) to audibly communicate with pedestrians or other nearby vehicles, one or more of which can include acoustic beam steering technology.

The communication connection(s) 510 can enable communication between the vehicle 502 and one or more other local or remote computing device(s), such as simulation system(s) 532. For instance, the communication connection(s) 510 can facilitate communication with other local computing device(s) on the vehicle 502 and/or the drive module(s) 514. Also, the communication connection(s) 510 can allow the vehicle to communicate with other nearby computing device(s) (e.g., other nearby vehicles, traffic signals, etc.). The communications connection(s) 510 also enable the vehicle 502 to communicate with a remote teleoperations computing device or other remote services.

The communications connection(s) 510 can include physical and/or logical interfaces for connecting the vehicle computing device 504 to another computing device or a network, such as the network(s) 530. For example, the communications connection(s) 510 can enable Wi-Fi-based communication such as via frequencies defined by the IEEE 502.11 standards, short range wireless frequencies such as Bluetooth®, cellular communication (e.g., 2G, 3G, 5G, 5G LTE, 5G, etc.) or any suitable wired or wireless communications protocol that enables the respective computing device to interface with the other computing device(s).

The drive module(s) 514 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive module(s) 514 can include a drive module controller which can receive and preprocess data from the sensor system(s) and to control operation of the various vehicle systems. In some examples, the drive module controller can include one or more processors and memory communicatively coupled with the one or more processors. The memory can store one or more modules to perform various functionalities of the drive module(s) 514. Furthermore, the drive module(s) 514 also include one or more communication connection(s) that enable communication by the respective drive module with one or more other local or remote computing device(s).

In some examples, the vehicle 502 can have a single drive module 514. In at least one example, if the vehicle 502 has multiple drive modules 514, individual drive modules 514 can be positioned on opposite ends of the vehicle 502 (e.g., the front and the rear, etc.). In at least one example, the drive module(s) 514 can include one or more sensor systems to detect conditions of the drive module(s) 514 and/or the surroundings of the vehicle 502. By way of example and not limitation, the sensor system(s) can include one or more wheel encoders (e.g., rotary encoders) to sense rotation of the wheels of the drive modules, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive module, LiDAR sensors, radar sensors, etc. Some sensors, such as the wheel encoders can be unique to the drive module(s) 514. In some cases, the sensor system(s) on the drive module(s) 514 can overlap or supplement corresponding systems of the vehicle 502 (e.g., sensor system(s) 506).

In at least one example, the localization component 520, the perception component 522, and/or the planning component 524 can process sensor data, as described above, and can send their respective outputs, over the network(s) 530, to the simulation system(s) 532. In at least one example, the localization component 520, the perception component 522, and/or the planning component 524 can send their respective outputs to the simulation system(s) 532 at a particular frequency, after a lapse of a predetermined period of time, in near real-time, etc. In some examples, the vehicle 502 can send raw sensor data to the simulation system(s) 532. In other examples, the vehicle 502 can send processed sensor data and/or representations of sensor data to the simulation system(s) 532. In some examples, the vehicle 502 can send sensor data to the simulation system(s) 532 at a particular frequency, after a lapse of a predetermined period of time, in near real-time, etc. In some cases, the vehicle 502 can send sensor data (raw or processed) to the simulation system(s) 532 as one or more log files.

In at least some examples, the simulation system(s) 532 can include one or more processors 534 and memory 536 communicatively coupled with the one or more processors 534. The simulation system(s) 532 also may include simulation scenarios 542 and a simulator 544. Also in the illustrated example, the memory 536 of the simulation system(s) 532 stores the Simulated LiDAR data generator 118, which includes the depth offset generator 122 and the intensity value generator 124, the environment data 116, and the LiDAR sensor parameters 120. In at least one example, the simulation system(s) 532 can include some or all of the functionality of the simulation system 216 of FIG. 2 and/or the simulation system(s) 532 can communicate with the simulation system 216, e.g., to receive aspects of a simulated environment and/or data for generating a simulated environment.

The simulated LiDAR data generator 118 is described above in connection with FIG. 1. In general, the simulated LiDAR data generator 118 can include functionality to generate simulated LiDAR data 126, which can include points and/or point clouds. Individual points can include at least a position relative to a focal point and/or an intensity value. In some instances, the position may be expressed as a range from a focal point and azimuth relative to some reference direction. Simulated data generated by the simulated LiDAR data generator 118 may be used in simulation scenarios, e.g., to test outcomes of systems that receive LiDAR data as an input. The simulated LiDAR data generator 118 may include the depth offset generator 122 and the intensity value generator 124.

The depth offset generator 122 is described above in connection with FIG. 1. In general, the depth offset generator 122 can include functionality to determine a projected position of a point in an environment, e.g., relative to a focal point. Such projected position may be identified as a depth (or range) from a focal point (e.g., of a simulated LiDAR sensor) and an azimuth, or angle from a reference direction. In implementations, the depth offset generator 122 perform the functionality illustrated in and described with reference to FIG. 3. For instance, the depth offset generator 122 can generate an optical flow field representative of movement (e.g., relative movement) of objects in the environment at some instant. For example, the flow field information may be based on ground truth data for a simulated environment, based on a comparison of successive images (e.g., global shutter images), or other information (e.g., velocity information from radar scans). The depth offset generator 122 may also include functionality to determine timestamp information or time offset information, e.g., based on LiDAR sensor parameters 120. For example, the depth offset generator 122 can determine timestamps for individual of a plurality of angular offsets within an angular portion of a larger field of view. The depth offset generator 122 can also include functionality to determine projected (e.g., in time) positions for points in the environment, based on the timestamp data and the optical flow field.

The intensity value generator 124 may be the intensity value generator 124 described above. In general, the intensity value generator 124 can include functionality to determine pixel or point intensities for association with the depths determined by the depth offset generator 122. In some examples, the intensity value generator 124 can execute some or all of the process 400 described above. For instance, the intensity value generator 124 can determine an intensity value based on parameters associated with pixels and/or objects represented by such pixels. Such parameters can include metallicness, roughness, albedo, or other properties that may impact an intensity at which light reflects off the object.

The simulator 544 can include functionality to perform tests using the simulation scenarios 542 and the data generated by the simulated LiDAR data generator 118. In some examples, the simulator 544 can simulate processing associated with one or more components of the vehicle 502, e.g., to determine responses of the vehicle computing device(s) 504 to simulation scenarios. Such simulation scenarios 542 may be embodied as simulated LiDAR data generated by the simulated LiDAR data generator 118. For example, the simulator 544 can store or otherwise access performance parameters, e.g., which may describe preferred functioning for the autonomous vehicle 502, and determine whether the vehicle computer device(s) function, e.g., in response to the simulation scenarios 542, in a manner that complies the parameters. In examples, the simulator 544 can determine outcomes of simulations, e.g., by determining vehicle trajectories or the like resultant from processing conducted by the vehicle computing device(s) 504.

The processor(s) 516 of the vehicle 502 and the processor(s) 534 of the simulation system(s) 532 can be any suitable processor capable of executing instructions to process data and perform operations as described herein. By way of example and not limitation, the processor(s) 516, 534 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 518 and the memory 536 are examples of non-transitory computer-readable media. The memory 518 and the memory 536 can store an operating system and one or more software applications, instructions, programs, and/or data to implement the methods described herein and the functions attributed to the various systems. In various implementations, the memory can be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 5 is illustrated as a distributed system, in alternative examples, components of the vehicle 502 can be associated with the simulation system(s) 532 and/or components of the simulation system(s) 532 can be associated with the vehicle 502. That is, the vehicle 502 can perform one or more of the functions associated with the simulation system(s) 532, and vice versa. Moreover, and as detailed further herein, the simulation system(s) 532 are not limited to use with the vehicle 502. Any system that may benefit from simulated LiDAR data and/or simulated environments including simulated LiDAR data may benefit from aspects of this disclosure.

FIGS. 1, 3, 4, and 6 illustrate example processes in accordance with embodiments of the disclosure. These processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Figure 6:
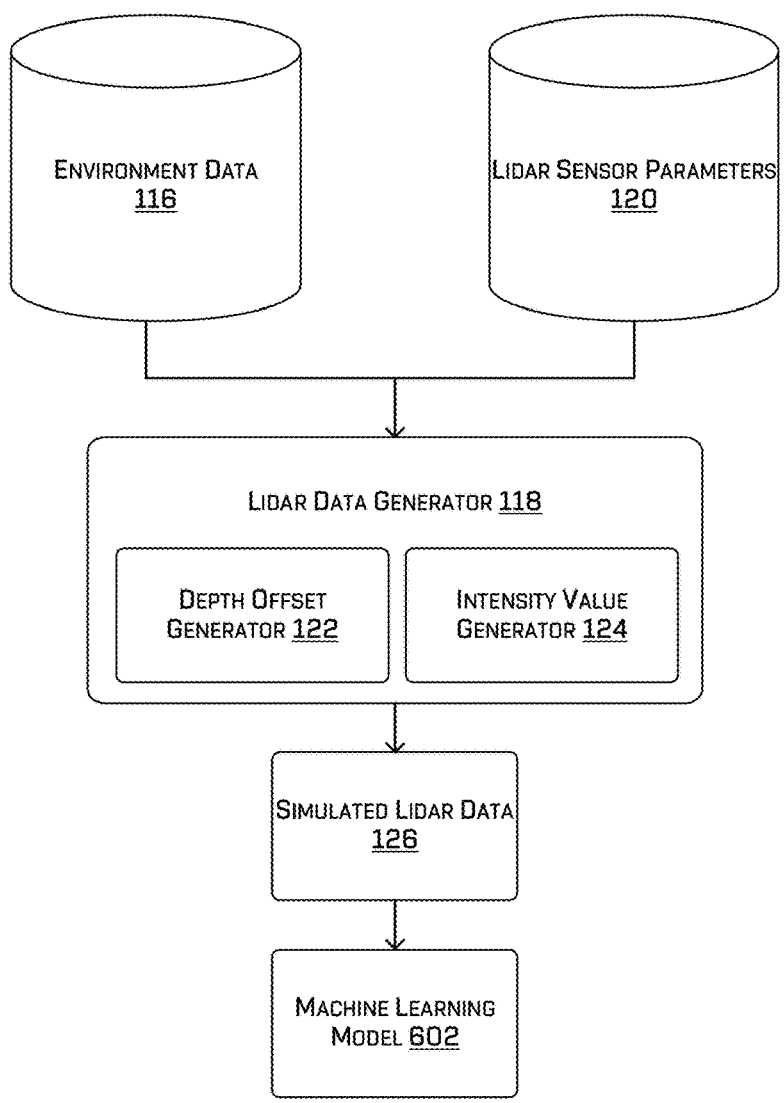
FIG. 6 is a schematic diagram illustrating an example process for generating and using simulated LiDAR data, according to examples of this disclosure.

FIG. 6 is a block diagram of an example system 600 for generating simulated LiDAR data 126 from environment data 116 for input into an example machine learning model 602 as training data for training the machine learning model 602. As noted above with respect to FIG. 1, the environment data 116 can include simulated and/or image or sensor-based data about an environment. For example, the environment data 116 can represent features and/or objects in an environment such as the simulated environment 200. In some examples, the environment data 116 may be derived from other data sources.

As shown in FIG. 6, the system 600 may also include LiDAR sensor parameters 120 indicative of parameters related to a LiDAR sensor, the output of which is being simulated, as described previously herein. For example, a LiDAR sensor may have technical characteristics related to performance, such as, for example, an orientation of a column or array of light emitted by the sensor, a direction of rotation of the sensor, a scan rate of the sensor, a field of view of the sensor, a wavelength of the emitted light, or other characteristics, any combination of which may be inherent to a particular LiDAR sensor and may affect attributes of returns or points captured by the particular LiDAR sensor.

The example system 600 may include the simulated LiDAR data generator 118 configured to receive (and/or access) the environment data 116 and, in some examples, receive (and/or access) the LiDAR sensor parameters 120. As shown, the simulated LiDAR data generator 118 may include a depth offset generator 122 configured to determine projected positions of points in the environment data, for example, as explained in more detail herein. In some examples, the simulated LiDAR data generator 118 may include an intensity value generator 124 configured to determine intensity values for points in the environment data 116, for example, as explained in more detail herein. In some examples, the simulated LiDAR data 126 may be used to generate point clouds which may be stored in memory in a database, processed, reproduced, and/or displayed on a display device.

As shown in FIG. 6, the system 600 may include a machine learning model 602 configured to receive training data including, for example, at least the simulated LiDAR data 126. For example, the machine learning model 602 may be in communication with the simulated LiDAR data generator 118. The machine learning model 602 may be any analytic model capable of using the simulated LiDAR data 126 as training data, such as, for example, a system for assisting with navigation and/or control of a vehicle, such as, for example, a semi-autonomous vehicle and/or a fully autonomous vehicle, as described herein. The machine learning model 602 may be stored in memory and may include any models, algorithms, and/or machine learning algorithms, which may be implemented, for example, as a neural network.

As described herein, an exemplary neural network is a biologically inspired algorithm which passes input data through a series of connected layers to produce an output. Each layer in a neural network may also include another neural network, or may include any number of layers (whether convolutional or not). As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks, such as, for example, ResNet50, ResNet101, VGG, DenseNet, PointNet, and the like.

Example Clauses

A: An example system for generating simulated LiDAR data, the system comprising: one or more processors; and memory storing instructions executable by the one or more processors to perform acts comprising: generating a simulated environment comprising at least an object located at a position relative to a focal point of a simulated LiDAR sensor; determining, based at least in part on the simulated environment, a depth image corresponding to a portion of the simulated environment; determining, based at least in part on the depth image, an optical flow field indicative of motion in the simulated environment; receiving parameters associated with the simulated LiDAR sensor; and generating, based at least in part on the optical flow field, simulated LiDAR data comprising simulated LiDAR points representative of the simulated environment.

B: The system of example A, wherein: the simulated environment comprises velocity information indicative of motion of one or more of the object or the simulated LiDAR; and the optical flow field is determined based at least in part on the velocity information.

C: The system of example A or example B, wherein: the depth image comprises a raster image associated with a depth buffer.

D: The system of any one of example A through example C, wherein the depth image has a width corresponding to an angle about the focal point and the parameters associated with the simulated LiDAR sensor include a scan rate of the simulated LiDAR sensor, the acts further comprising: associating, based at least in part on the scan rate, a plurality of timestamps with a plurality of angular offsets within the angle about the focal point, wherein generating the simulated LiDAR data comprises: determining a point in the depth image along an optical flow vector in the optical flow field a distance based at least in part on a time associated with a timestamp of the plurality of timestamps to determine an updated point, and determining, from the depth image, a depth associated with the updated point, wherein the simulated LiDAR points include a simulated LiDAR point at a position associated with the point and having a depth value equal to the depth associated with the updated point.

E: The system of any one of example A through example D, the actions further comprising: identifying one or more physical attributes associated with the first point; and determining, based at least in part on the one or more physical attributes, an intensity value for the first point, the first simulated LiDAR point further including the intensity value.

F: The system of any one of example A through example E, wherein the one or more physical attributes include at least one of a metallicness, a roughness, or a value associated with albedo.

G: An example method includes: receiving data about a simulated environment; determining, based at least in part on the data, depth information of a first portion of the simulated environment, the first portion corresponding to an angle about a focal point of a simulated LiDAR sensor; determining a flow field associated with the depth information; determining, based at least in part on the depth information, a first set of points, a point of the first set of points having one or more of a depth and an intensity; and determining, based at least in part on the first set of points, the flow field, and one or more parameters associated with a simulated LiDAR sensor, a simulated LiDAR return comprising a second set of points.

H: The method of example G, wherein: the flow field is indicative of movement of objects in the environment relative to the focal point, determining the flow field comprises receiving ground truth velocities associated with portions of the data, and the flow field is based at least in part on the ground truth velocities.

I: The method of example G or example H, wherein the depth information comprises first depth information about the environment representative of a first time and second depth information about the environment representative of a second time after the first time; and determining the flow field comprises determining optical flow vectors representative of differences between the first data and the second data.

J: The method of any one of example G through example I, wherein the parameters associated with the simulated LiDAR sensor comprise at least one of a two-dimensional velocity of the LiDAR sensor, a scan rate of the LiDAR sensor, or a scanning direction of the LiDAR sensor.

K: The method of any one of example G through example J, further comprising: based at least in part on the parameters, associating timestamps with angular offsets within the angle, wherein determining the second set of points comprises, for a first point of the first set of points, determining an estimated depth based at least in part on a first timestamp of the plurality of timestamps.

L: The method of any one of example G through example K, wherein the offset distance is determined based at least in part on determining an updated position based at least in part on a flow vector in the flow field corresponding to a first position of the first point and a time determined based at least in part on the first timestamp.

M: The method of any one of example G through example L, wherein the depth information comprises a depth determined based at least in part from a depth buffer.

N: The method of any one of example G through example M, further comprising: receiving one or more physical attributes associated with the first point; and determining, based at least in part on the one or more physical attributes, an intensity value for the first point, the simulated LiDAR point further including the intensity value.

O: The method of any one of example G through example N, wherein the physical attributes comprise at least one of a metallicness, a roughness, or a value associated with albedo.

P: The method of any one of example G through example O, further comprising: generating simulated LiDAR data representative of the environment comprising the simulated LiDAR return and one or more additional simulated LiDAR returns associated with the environment; passing the simulated LiDAR returns to an autonomous vehicle control system configured to receive LiDAR data and navigate environments based at least in part on the LiDAR data; and determining a response of the autonomous vehicle controls system to the simulated LiDAR data.

Q: One or more example non-transitory computer-readable media storing instructions executable by one or more processors, wherein the instructions, when executed, cause the one or more processors to perform operations comprising: receiving data about a simulated environment; determining, based at least in part on the data, depth information of a first portion of the simulated environment, the first portion corresponding to an angle about a focal point of a simulated LiDAR sensor; determining a flow field associated with the depth information; determining, based at least in part on the depth information, a first set of points, a point of the first set of points having one or more of a depth and an intensity; and determining, based at least in part on the first set of points, the flow field, and one or more parameters associated with a simulated LiDAR sensor, a simulated LiDAR return comprising a second set of points.

R: The one or more non-transitory computer-readable media of example Q, the operations further comprising: receiving physical attributes of the object at a surface of the object at the first position; and determining, based at least in part on the physical attributes, an intensity value associated with the first position, wherein the simulated LiDAR return further includes the intensity value as the intensity.

S: The one or more non-transitory computer-readable media of example Q or example R, wherein the physical attributes comprise at least one of a metallicness, a roughness, or a value associated with albedo.

T: The one or more non-transitory computer-readable media of any one of example Q through example S, the operations further comprising: based at least in part on the parameters, associating timestamps with angular offsets within the angle, projecting the first point along a flow vector in the flow field corresponding to a first angular position of the first point for a time determined based at least in part on a first timestamp of the timestamps to determine an estimated depth, the simulated LiDAR return including a second point having a position associated with the angular position of the first point and the estimated depth.

What is claimed is:

1. A method comprising:
receiving data about a simulated environment;
determining, based at least in part on the data, depth information of a first portion of the simulated environment, the first portion corresponding to an angle about a focal point of a simulated LiDAR sensor, the depth information including a plurality of pixels and depths associated with the plurality of pixels;

determining, based at least in part on ground truth velocity information, a flow field associated with the depth information;

receiving a parameter associated with the simulated LiDAR sensor, the parameter including at least a scan rate of the simulated LiDAR sensor;

determining, based at least in part on the depth information, a first set of points, a point of the first set of points having one or more of a depth and an intensity;

projecting the point in the depth information along an optical flow vector in the flow field and based at least in part on the parameter; and determining, based at least in part on the projecting the point, a simulated LiDAR return comprising a second set of points.

2. The method of claim 1, wherein:
the flow field is indicative of movement of objects in the simulated environment relative to the focal point, and
determining the flow field comprises receiving the ground truth velocity information associated with portions of the data.

3. The method of claim 1, wherein the depth information comprises first depth information about an environment representative of a first time and second depth information about the environment representative of a second time after the first time; and
determining the flow field comprises determining optical flow vectors representative of differences between the first depth information and the second depth information.

4. The method of claim 1, wherein the parameter associated with the simulated LiDAR sensor further comprises at least one of a two-dimensional velocity of the simulated LiDAR sensor, or a scanning direction of the simulated LiDAR sensor.

5. The method of claim 1, further comprising:
based at least in part on the parameter, associating a plurality of timestamps with angular offsets within the angle,
wherein determining the second set of points comprises, for a first point of the first set of points, determining an estimated depth based at least in part on a first timestamp of the plurality of timestamps.

6. The method of claim 5, wherein an offset distance associated with an angular offset of the angular offsets is based at least in part on determining an updated position based at least in part on the optical flow vector in the flow field corresponding to a first position of the first point and a time determined based at least in part on the first timestamp.

7. The method of claim 1, wherein the depth information comprises a depth image determined based at least in part from a depth buffer.

8. The method of claim 1, further comprising:
receiving one or more physical attributes associated with the first set of points; and
determining, based at least in part on the one or more physical attributes, intensity values for the first set of points, the simulated LiDAR return further including the intensity values.

9. The method of claim 1, further comprising:
generating simulated LiDAR data representative of the simulated environment comprising the simulated LiDAR return and one or more additional simulated LiDAR returns associated with the simulated environment;

passing the simulated LiDAR return and the one or more additional simulated LiDAR returns to an autonomous vehicle control system configured to receive LiDAR data and navigate the simulated environment based at least in part on the LiDAR data; and determining a response of the autonomous vehicle control system to the simulated LiDAR data.

10. One or more non-transitory computer-readable media storing instructions executable by one or more processors, wherein the instructions, when executed, cause the one or more processors to perform operations comprising:

receiving data about a simulated environment;

determining, based at least in part on the data, depth information of a first portion of the simulated environment, the first portion corresponding to an angle about a focal point of a simulated LiDAR sensor, the depth information including a plurality of pixels and depths associated with the plurality of pixels;

determining, based at least in part on simulated velocity information, a flow field associated with the depth information;

receiving a parameter associated with the simulated LiDAR sensor, the parameter including at least a scan rate of the simulated LiDAR sensor;

determining, based at least in part on the depth information, a first set of points, a point of the first set of points having one or more of a depth and an intensity;

projecting the point in the depth information along an optical flow vector in the flow field and based at least in part on the parameter; and determining, based at least in part on the projecting the point, a simulated LiDAR return comprising a second set of points.

11. The one or more non-transitory computer-readable media of claim 10, the operations further comprising:
receiving physical attributes of a surface of an object at a first position; and
determining, based at least in part on the physical attributes, an intensity value associated with the first position,
wherein the simulated LiDAR return further includes the intensity value as the intensity.

12. The one or more non-transitory computer-readable media of claim 11, wherein the physical attributes comprise at least one of a metallicness, a roughness, or a value associated with albedo.

13. The one or more non-transitory computer-readable media of claim 10, wherein the point is a first point, the operations further comprising:
based at least in part on the parameter, associating timestamps with angular offsets within the angle,
projecting the first point along the optical flow vector in the flow field corresponding to a first angular position of the first point for a time determined based at least in part on a first timestamp of the timestamps to determine an estimated depth, the simulated LiDAR return including a second point having a position associated with the first angular position of the first point and the estimated depth.

14. The one or more non-transitory computer-readable media of claim 10, wherein the simulated velocity information comprises relative velocity information between the point and the simulated LiDAR sensor.

15. A system for generating simulated LiDAR data, the system comprising:
- one or more processors; and
- memory storing instructions executable by the one or more processors to perform acts comprising:
- generating a simulated environment comprising at least an object located at a position relative to a focal point of a simulated LiDAR sensor; determining, based at least in part on the simulated environment, a depth image corresponding to a portion of the simulated environment, the depth image including a plurality of pixels and depths associated with the plurality of pixels;
- determining, based at least in part on the depth image and simulated velocity information, an optical flow field indicative of motion in the simulated environment;
- receiving parameters associated with the simulated LiDAR sensor, the parameters including at least a scan rate of the simulated LiDAR sensor;
- projecting a point in the depth image along an optical flow vector in the optical flow field and based at least in part on the parameters; and
- generating, based at least in part on the projecting the point, simulated LiDAR data comprising simulated LiDAR points representative of the simulated environment.

16. The system of claim 15, wherein:
the simulated velocity information is indicative of motion of one or more of the object or the simulated LiDAR sensor.

17. The system of claim 15, wherein the depth image comprises a raster image associated with a depth buffer.

18. The system of claim 15, wherein the depth image has a width corresponding to an angle about the focal point, the acts further comprising:
- associating, based at least in part on the scan rate, a plurality of timestamps with a plurality of angular offsets within the angle about the focal point,
- wherein generating the simulated LiDAR data comprises:
  - projecting the point in the depth image along the optical flow vector in the optical flow field a distance based at least in part on a time associated with a timestamp of the plurality of timestamps to determine an updated point, and
  - determining, from the depth image, a depth associated with the updated point,
- wherein the simulated LiDAR points include a simulated LiDAR point at a position associated with the point and having a depth value equal to the depth associated with the updated point.

19. The system of claim 18, the acts further comprising:
- identifying one or more physical attributes associated with the point; and
- determining, based at least in part on the one or more physical attributes, an intensity value for the point, the simulated LiDAR point further including the intensity value.

20. The system of claim 19, wherein the one or more physical attributes include at least one of a metallicness, a roughness, or a value associated with albedo.

* * * * *